(12) United States Patent
Cohen et al.

(10) Patent No.: US 10,128,393 B2
(45) Date of Patent: Nov. 13, 2018

(54) CONNECTION ASSEMBLY PROTECTION

(75) Inventors: Brian E. Cohen, Perrysburg, OH (US); Jianjun Wang, Perrysburg, OH (US); Rui Xiao, Sylvania, OH (US)

(73) Assignee: First Solar, Inc., Perrysburg, OH (US)

( * ) Notice: Subject to any disclaimer, the term of this patent is extended or adjusted under 35 U.S.C. 154(b) by 17 days.

(21) Appl. No.: 13/187,107

(22) Filed: Jul. 20, 2011

(65) Prior Publication Data

US 2012/0017968 A1   Jan. 26, 2012

Related U.S. Application Data

(60) Provisional application No. 61/366,411, filed on Jul. 21, 2010.

(51) Int. Cl.
| | |
|---|---|
| *H01L 31/05* | (2014.01) |
| *H01L 31/02* | (2006.01) |
| *H02S 40/34* | (2014.01) |

(52) U.S. Cl.
CPC ...... *H01L 31/0504* (2013.01); *H01L 31/0201* (2013.01); *H01L 31/02008* (2013.01); *H01L 31/02013* (2013.01); *H02S 40/34* (2014.12); *Y02E 10/50* (2013.01)

(58) Field of Classification Search
CPC ......... H01L 31/02008; H01L 31/02013; H01L 31/0201; H01L 31/0504; H01L 31/02002; H01L 31/05; H01L 31/0516; H02S 40/32; H02S 40/34; H02S 40/36
See application file for complete search history.

(56) References Cited

U.S. PATENT DOCUMENTS

| | | | | |
|---|---|---|---|---|
| 5,280,133 | A | * | 1/1994 | Nath ............................ 174/373 |
| 5,366,604 | A | | 11/1994 | Stilley |
| 5,660,646 | A | * | 8/1997 | Kataoka et al. ............. 136/251 |
| 5,858,120 | A | * | 1/1999 | Nakagawa et al. .......... 136/256 |
| 5,863,354 | A | | 1/1999 | Yoshida |
| 5,897,715 | A | * | 4/1999 | Ward et al. .................. 136/244 |
| 6,248,948 | B1 | * | 6/2001 | Nakagawa et al. .......... 136/244 |
| 6,288,326 | B1 | | 9/2001 | Hayashi et al. |
| 6,380,478 | B1 | * | 4/2002 | Yamamoto et al. ......... 136/244 |
| 7,355,114 | B2 | * | 4/2008 | Ojima et al. ................. 136/243 |
| 7,902,301 | B2 | | 3/2011 | Kempe et al. |
| 8,816,185 | B2 | | 8/2014 | Caster et al. |

(Continued)

FOREIGN PATENT DOCUMENTS

| | | |
|---|---|---|
| CN | 201289852 | 8/2009 |
| CN | 102598462 A | 7/2012 |

(Continued)

OTHER PUBLICATIONS

Machine Translation of DE 10 2008 050332; accessed May 4, 2014.*

(Continued)

*Primary Examiner* — Edward J. Schmiedel
(74) *Attorney, Agent, or Firm* — MacMillan, Sobanski & Todd, LLC

(57) ABSTRACT

A photovoltaic module may include an electrical connection assembly with increased corrosion protection. The module may be protected from corrosion by using a high number of photovoltaic cells, by providing protective materials over module components subject to corrosion, and/or by adjusting the size ratio of the positive components to the negative components within the module.

6 Claims, 11 Drawing Sheets

(56) References Cited

U.S. PATENT DOCUMENTS

| | | |
|---|---|---|
| 2004/0084079 A1 | 5/2004 | Romero et al. |
| 2007/0235077 A1* | 10/2007 | Nagata et al. ............... 136/256 |
| 2008/0053511 A1* | 3/2008 | Nakamura ......... H01L 31/0201 |
| | | 136/244 |
| 2008/0142070 A1 | 6/2008 | Lechner et al. |
| 2008/0169022 A1 | 7/2008 | Matsui et al. |
| 2008/0194154 A1* | 8/2008 | Minnick ..................... 439/842 |
| 2008/0271774 A1 | 11/2008 | Kalkanoglu et al. |
| 2009/0032084 A1* | 2/2009 | Aiken et al. .................. 136/246 |
| 2009/0188181 A1 | 7/2009 | Forbis et al. |
| 2009/0205710 A1 | 8/2009 | Kim et al. |
| 2010/0132777 A1 | 6/2010 | Inoue et al. |
| 2010/0229944 A1 | 9/2010 | Nishijima et al. |
| 2010/0236607 A1 | 9/2010 | Korevaar et al. |
| 2010/0248418 A1 | 9/2010 | Morooka et al. |
| 2011/0023942 A1 | 2/2011 | Soegding et al. |
| 2011/0088742 A1* | 4/2011 | Casler ............... H01L 31/02008 |
| | | 136/244 |
| 2011/0088753 A1 | 4/2011 | Ahlgren et al. |
| 2011/0262712 A1 | 10/2011 | Little et al. |
| 2013/0008481 A1 | 1/2013 | Chow et al. |

FOREIGN PATENT DOCUMENTS

| | | |
|---|---|---|
| DE | 10 2008 050 332 A1 | 4/2010 |
| EP | 1307925 A2 | 5/2003 |
| EP | 1 930 948 A1 | 6/2008 |
| EP | 2 164 108 A1 | 3/2010 |
| GB | 2229736 | 10/1990 |
| JP | 58-115872 A | 7/1983 |
| JP | S58115872 A | 7/1983 |
| JP | 60214550 | 10/1985 |
| JP | 61053785 | 3/1986 |
| JP | 61267373 | 11/1986 |
| JP | 62299090 | 12/1987 |
| JP | 2000216422 | 8/2000 |
| JP | 2001060701 | 3/2001 |
| JP | 2003069064 | 3/2003 |
| JP | 2004200490 | 7/2004 |
| JP | 2005-353767 A | 12/2005 |
| JP | 2006286893 | 10/2006 |
| JP | 2006319081 | 11/2006 |
| JP | 2009188299 | 8/2009 |
| JP | 2009188357 | 8/2009 |
| JP | 2010219174 | 9/2010 |
| JP | 2010258255 | 11/2010 |
| JP | 2010272658 | 12/2010 |

OTHER PUBLICATIONS tape. Oxford Dictionaries. Oxford University Press, n.d. Web. Feb. 6, 2016. http://www.oxforddictionaries.com/us/definition/american_english/tape.*

First Solar FS Series 2 PV Module Datasheet, May 2011.

Indian Office Action, Application No. 1002/DELNP/2013, dated Jun. 26, 2018.

* cited by examiner

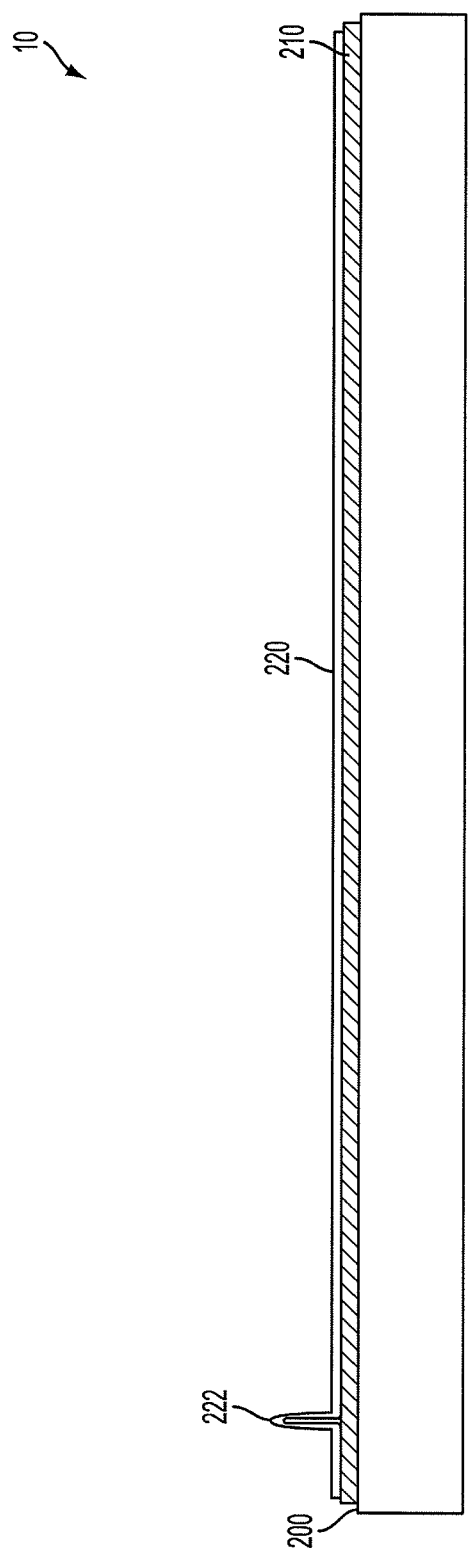

CONNECTION ASSEMBLY PROTECTION

CROSS-REFERENCE TO RELATED APPLICATIONS

This application claims the benefit of U.S. provisional application 61/366,411, filed on Jul. 21, 2010, which is incorporated herein by reference in its entirety.

TECHNICAL FIELD

The present invention relates to photovoltaic modules and methods of production.

BACKGROUND

A photovoltaic module may include multiple interconnected cells, connected in series and/or parallel. A connection assembly may be electrically connected to the photovoltaic module, adjacent to the interconnected cells, to facilitate connection between the photovoltaic module and other electrical components, including, for example, one or more additional photovoltaic modules. Photovoltaic modules may include one or more layers within, which may cause the electrical connection assembly to be more susceptible to corrosion.

DESCRIPTION OF DRAWINGS

FIG. 11 is a side view of the photovoltaic module of FIG. 1.

DETAILED DESCRIPTION

Figure 1:
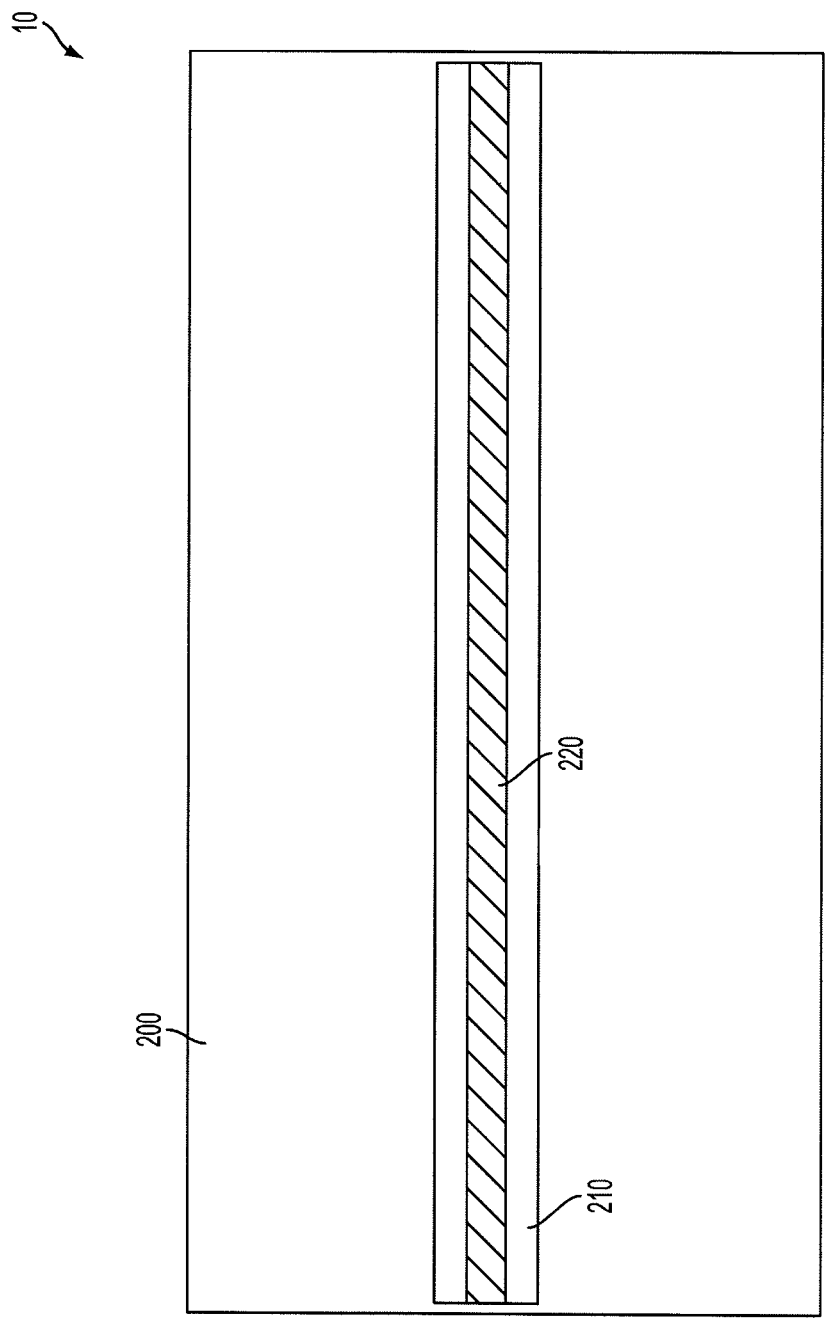
FIG. 1 is a schematic of a photovoltaic module including first and second conductors.

Photovoltaic modules can include multiple layers (or coating) created on a substrate (or superstrate). For example, a photovoltaic device can include a barrier layer, a transparent conductive oxide (TCO) layer, a buffer layer, and a semiconductor layer formed in a stack on a substrate. Each layer may in turn include more than one layer or film. For example, the semiconductor layer can include a first film including a semiconductor window layer, such as a cadmium sulfide layer, formed on the buffer layer and a second film including a semiconductor absorber layer, such as a cadmium telluride layer formed on the semiconductor window layer. Additionally, each layer can cover all or a portion of the device and/or all or a portion of the layer or substrate underlying the layer. For example, a "layer" can include any amount of any material that contacts all or a portion of a surface.

A photovoltaic module may include a connection assembly for electrically connecting one or more electrical components to the module, including, for example, one or more additional photovoltaic modules. The assembly may contain various suitable components, including, for example, one or more bussing components or assemblies. For example, one or more conductors may be applied adjacent to a contact layer of a photovoltaic module. The conductors may include any suitable material, including, for example, one or more lead foils. A common or main conductor may be applied adjacent to the one or more conductors. For example, one or more bus bars may be applied adjacent to one or more lead foils. One or more tape strips (e.g., double-sided tape) may also be used to secure conductive material to the module.

Following deposition of one or more layers (or coating) of a photovoltaic module, one or more interlayers may be deposited onto the module substrate, substantially proximate to any one of the deposited coatings. The interlayers can include any suitable material. One example of an interlayer material is ethylene-vinyl acetate (EVA). During and/or subsequent to manufacture and/or processing of the photovoltaic module, corrosive by-products (such as acids) can be formed or introduced into the module. For example, during lamination of the interlayer (for example, an EVA interlayer), an acid such as acetic acid can be formed. Corrosive substances such as acids can have a corrosive effect on metal components of the photovoltaic module. For example, an acid such as acetic acid can corrode conductors within the module. Some examples of module components that can be corroded by acids are conductive leads such as lead foils, common conductors such as bus bars, and other bussing components. Corrosion to such components can be by various corrosive mechanisms, such as galvanic corrosion and/or pitting corrosion. For example, in the case of an assembly including a tin-coated copper lead foil, the following reactions may occur when the lead foil is exposed to an acid:

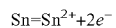

$Sn = Sn^{2+} + 2e^-$

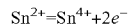

$Sn^{2+} = Sn^{4+} + 2e^-$

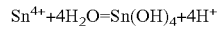

$Sn^{4+} + 4H_2O = Sn(OH)_4 + 4H^+$

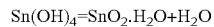

$Sn(OH)_4 = SnO_2 \cdot H_2O + H_2O$

Testing of connection assembly materials exposed to acidic solutions has confirmed the existence of corrosion pits as well as tin oxide, the final product of corrosion. Further, a residual peroxide (oxidizer) may remain on the connection assembly materials if the EVA interlayer is not fully cured.

It would be desirable to fabricate a photovoltaic module having a lower susceptibility to corrosion. A variety of suitable methods are available for achieving such a goal. For example, the relative portion of positive to negative components in the connection assembly may be decreased. The negative components have low potential and are thus protected by cathodic current. The positive components, on the other hand, have high potential and lack cathodic protection. Therefore it is possible to reduce the likelihood of corrosion occurring by reducing the portion of positive metal components, and/or increasing the portion of negative components.

Alternatively, or in conjunction therewith, an overlay may be positioned on top of the positive components of the connection assembly. For example, an overlay may be positioned on over a positive lead foil. The overlay may include any suitable material, including, for example, polyethylene terephthalate (PET), or any suitable insulating polymeric material. For example, an overlay of PET may be applied on top of the positive common conductor and lead foil, thereby preventing corrosion of metal from occurring. The overlay may contain an adhesive on one or both sides. For example, a suitable overlay may include a double-sided tape including a polyethylene terephthalate.

The corrosion rate may also be mitigated by using a high module cell count (e.g., more than 100, more than 120, more than 140, less than 180, less than 160, or less than 140). Photovoltaic cell count can have a substantial impact on corrosion rate. Testing has shown that increased cell count can lead to lower current density of the lead foil, thereby resulting in a lower corrosion rate. For example, photovoltaic modules having a cell count of 144 have demonstrated a lead foil current density of over about 3.8 $\mu A/\mu m^2$, and a corrosion rate of more than about 70%. Conversely, photovoltaic modules having a cell count of 154 or more have demonstrated a current density of less than about 3.7 $\mu A/\mu m^2$, and a corrosion rate of less than about 35%. Therefore increasing the number of cells in a photovoltaic module can result in a reduced rate of corrosion.

In one aspect, a photovoltaic module may include a plurality of interconnected photovoltaic cells, collectively comprising a contact region. The photovoltaic module may include a first region including a first conductor adjacent to the contact region. The first conductor may be configured to receive a negative charge. The photovoltaic module may include a second region including a second conductor adjacent to the contact region. The second conductor may be configured to receive a positive charge. The first region may be substantially larger than the second region. Material within or substantially proximate to the second region may be susceptible to corrosion.

The first conductor may include a lead foil. The second conductor may include a lead foil. The first conductor may include a common conductor configured to electrically connect each one of the plurality of interconnected photovoltaic cells to one another. The second conductor may include a common conductor configured to electrically connect each one of the plurality of interconnected photovoltaic cells to one another. The first conductor may include a common conductor configured to electrically connect the plurality of interconnected photovoltaic cells. The second conductor may include two common conductors, each configured to electrically connect each one of the plurality of interconnected photovoltaic cells to one another. The photovoltaic module may include an interlayer material proximate to the positive region. The first conductor may be longer than the second conductor by a factor of 1.5 or more. The first region may have a surface area larger than the second region by a factor of 1.5 or more. The first conductor may be longer than the second conductor by a factor of 5 or less. The first region may have a surface area larger than the second region by a factor of 5 or less.

In another aspect, a photovoltaic module may include a plurality of interconnected photovoltaic cells, collectively comprising a contact region. The photovoltaic module may include a first region including a first conductor adjacent to the contact region. The first conductor may be configured to receive a negative charge. The photovoltaic module may include a second region including a second conductor adjacent to the contact region. The second conductor may be configured to receive a positive charge. The photovoltaic module may include an overlay substantially covering the second region.

The overlay may include a polyethylene terephthalate (PET). The overlay may include an insulating polymeric material. The overlay may include a strip of tape having at least one adhesive surface. The overlay may substantially cover the second conductor. The overlay may substantially cover the second region. The photovoltaic module may include an interlayer material proximate to the positive region. The interlayer may include any suitable material, including, for example, acrylonitrile butadiene styrene (ABS), acrylic (PMMA), celluloid, cellulose acetate, cycloolefin copolymer (COC), ethylene-vinyl acetate (EVA), ethylene vinyl alcohol (EVOH), fluoroplasics (PTFE), ionomers, KYDEX® (acrylic-polyvinyl chloride), liquid crystal polymer (LCP), polyacetal (POM), polyacrylates, polyacrylonitrile (PAN), polyamide (PA), polyamide-imide (PAI), polyaryletherketone (PAEK), polybutadiene (PBD), polybutylene (PB), polybutylene terephthalate (PBT), polycaprolactone (PCL), polychlorotrifluoroethylene (PCTFE), polyethylene terephthalate (PET), polycyclohexylene dimethylene terephthalate (PCT), polycarbonate (PC), polyhydroxyalkanoates (PHAs), polyketone (PK), polyester, polyethylene (PE), polyetheretherketone (PEEK), polyetherketoneketone (PEKK), polyetherimide (PEI), polyethersulfone (PES), polyethylenechlorinates (PEC), polyimide (PI), polyactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polytrimethylene terephthalate (PTT), polyurethane (PU), polyvinyl acetate (PVA), polyvinyl chloride (PVC), polyvinylidene chloride (PVDC), styrene-acrylonitrile (SAN), butyl rubber, or any combination thereof.

In another aspect, a photovoltaic module may include a plurality of interconnected photovoltaic cells, collectively comprising a contact region. The plurality of interconnected photovoltaic cells may include 144 or more cells. The photovoltaic module may include a first region including a first conductor adjacent to the contact region. The first conductor may be configured to receive a negative charge. The photovoltaic module may include a second region including a second conductor adjacent to the contact region. The second conductor may be configured to receive a positive charge. The photovoltaic module may include an interlayer material proximate to the positive region.

In another aspect, a method of manufacturing a photovoltaic module may include electrically connecting a plurality of photovoltaic cells to form a collective contact region. The method may include positioning a first conductor adjacent to the contact region. The first positive conductor may be configured to receive a negative charge, and may at least partially defines a first region. The method may include positioning a second conductor adjacent to the contact region. The second conductor may be configured to receive a positive charge, and may at least partially defines a second region. The first region may be substantially larger than the second region. The method may include forming an interlayer proximate to the positive region.

In another aspect, a method of manufacturing a photovoltaic module may include electrically connecting a plurality of photovoltaic cells to form a collective contact region. The method may include positioning a first conductor adjacent to the contact region. The first positive conductor may be configured to receive a negative charge, and may at least partially define a first region. The method may include positioning a second conductor adjacent to the contact region. The second conductor may be configured to receive a positive charge, and may at least partially define a second region. The method may include positioning an overlay substantially covering the second region.

Positioning an overlay may include substantially covering the second region with a polyethylene terephthalate (PET). Positioning an overlay may include substantially covering the second region with an insulating polymeric material. Positioning an overlay may include substantially covering the second region with a strip of tape having at least one adhesive surface. Positioning an overlay may include substantially covering the first positive conductor. Positioning an overlay may include shielding the second region from exposure to an acid. The method may include depositing an interlayer material proximate to the positive region.

In another aspect, a method of manufacturing a photovoltaic module may include electrically connecting 144 or more photovoltaic cells to form a collective contact region. The method may include positioning a first conductor adjacent to the contact region. The first positive conductor may be configured to receive a negative charge, and may at least partially define a first region. The method may include positioning a second conductor adjacent to the contact region. The second conductor may be configured to receive a positive charge, and may at least partially define a second region. The method may include depositing an interlayer material proximate to the positive region.

In another aspect, a photovoltaic module may include a plurality of interconnected photovoltaic cells, collectively comprising a contact region. The plurality of interconnected photovoltaic cells may include 144 or more cells. The photovoltaic module may include a first region including a first conductor adjacent to the contact region. The first conductor may be configured to receive a negative charge. The photovoltaic module may include a second region including a second conductor adjacent to the contact region. The second conductor may be configured to receive a positive charge. The first region may be substantially larger than the second region. The photovoltaic module may include an overlay adjacent to the positive region.

Referring to FIG. 1, a connection assembly can be applied to a contact side of a photovoltaic module 10. The connection assembly may include any of a variety of suitable materials for allowing connection of photovoltaic module 10 to one or more electrical components, including, for example, one or more additional photovoltaic modules. For example, a suitable connection assembly may include one or more conductors applied adjacent to one another. A common conductor may be included and connected to one or more other conductors. The common conductor can be used to electrically connect one or more individual cells of the photovoltaic module. The assembly may include one or more lead foils adjacent to a contact layer of the photovoltaic module. One or more common conductors (e.g., bus bars) may be applied adjacent to the lead foils to connect the individual cells of the module. One or more materials may be applied adjacent to any of the conductive components of the connection assembly. The one or more materials may be used to arrange any of the conductive components to in a desired configuration. For example, the one or more materials may include one or more strips of tape. The strips of tape may include one or more adhesive surfaces. For example, a strip of insulative tape may be applied adjacent to a contact layer of the module, and one or more lead foils may be applied adjacent thereto. One or more common conductors may be positioned adjacent to and in contact with the lead foils.

For example, a first insulator tape strip 210, such as a double sided insulator tape strip, for example, can be applied to contact surface 200 of photovoltaic module 10, and a first lead foil 220 can be applied on top of insulator tape strip 210. First tape strip 210 can include an adhesive on its front and back sides. First tape strip 210 can have any suitable thickness. A smaller tape thickness can minimize stress on the module from the tape layout. Referring to FIG. 11, illustrating a side view of FIG. 1, first lead foil 220 may be applied on top of insulator tape strip 210 so that a portion of first lead foil 220 does not contact insulator tape strip 210 and forms a loop 222. Loop 222 may extend in a substantially orthogonal direction away from the top surface of insulator tape strip 210 and contact surface 200. Loop 222 may be divided or cut to form two lead ends that connect to a junction box.

Figure 2:
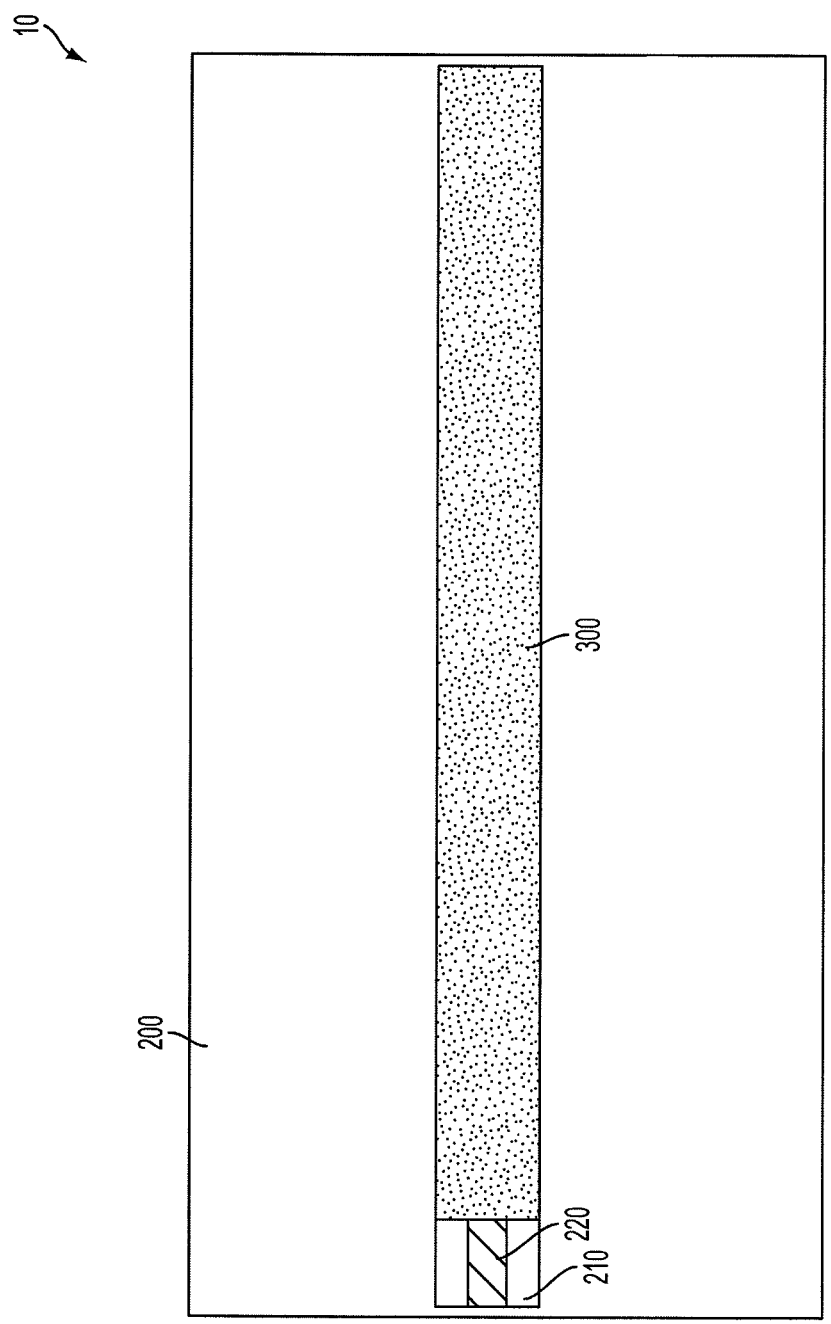
FIG. 2 is a schematic of a photovoltaic module including first and second conductors.

Referring to FIG. 2, a second strip of insulator tape 300, such as a double sided insulator tape strip, for example, can be applied on top of first tape strip 210. Second tape strip 300 can be positioned such that an end of second tape strip 300 is approximately one cell past the center of first tape strip 210.

Figure 3:
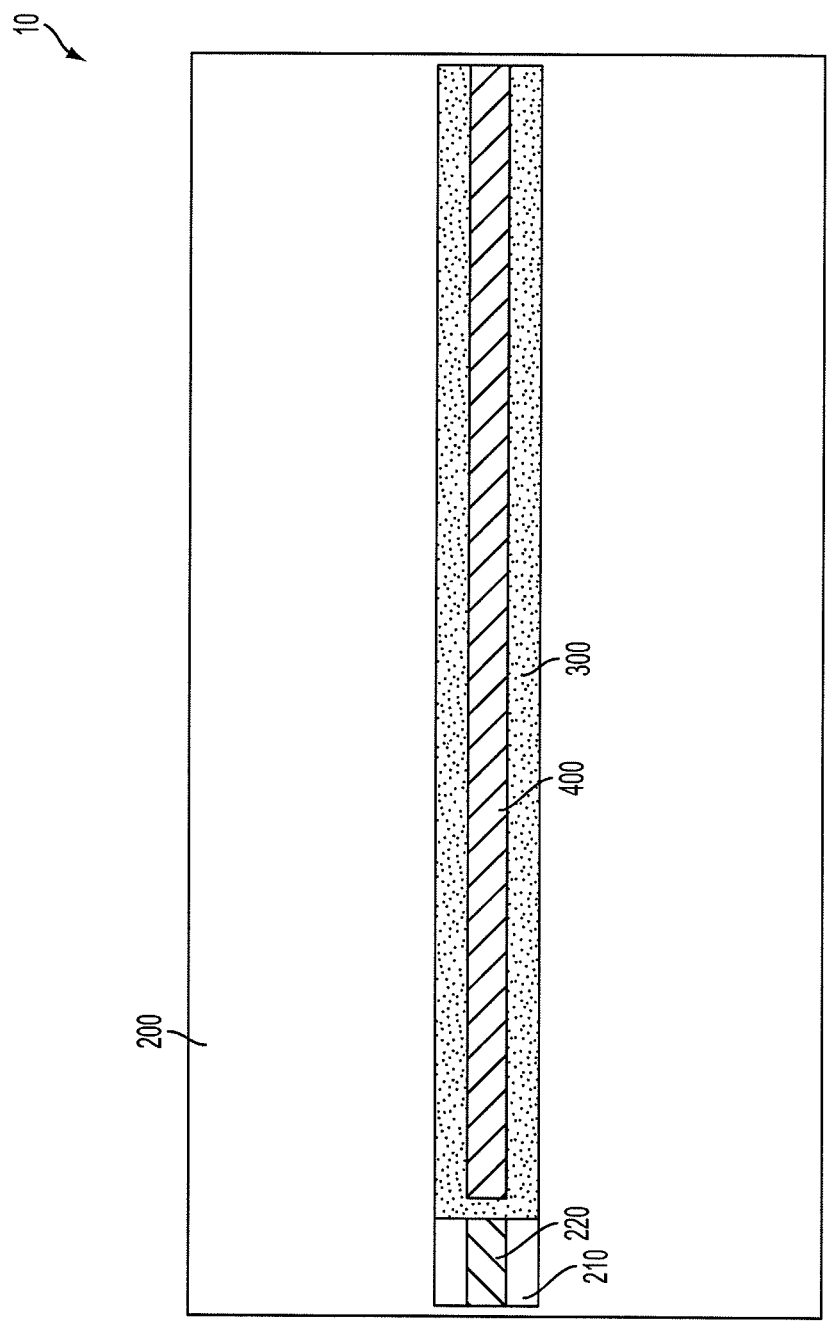
FIG. 3 is a schematic of a photovoltaic module including first and second conductors.
Figure 4:
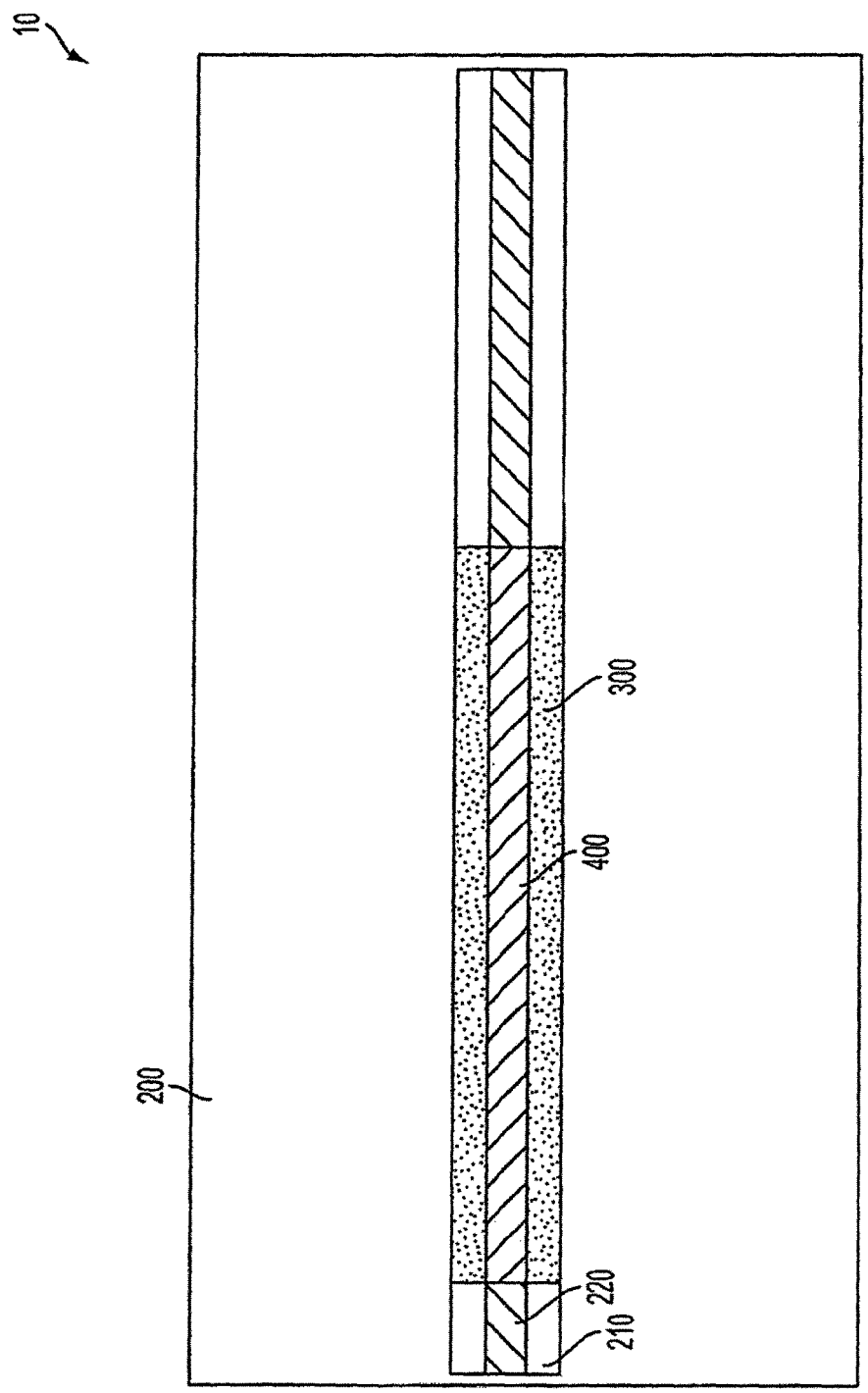
FIG. 4 is a schematic of a photovoltaic module including first and second conductors.
Figure 5:
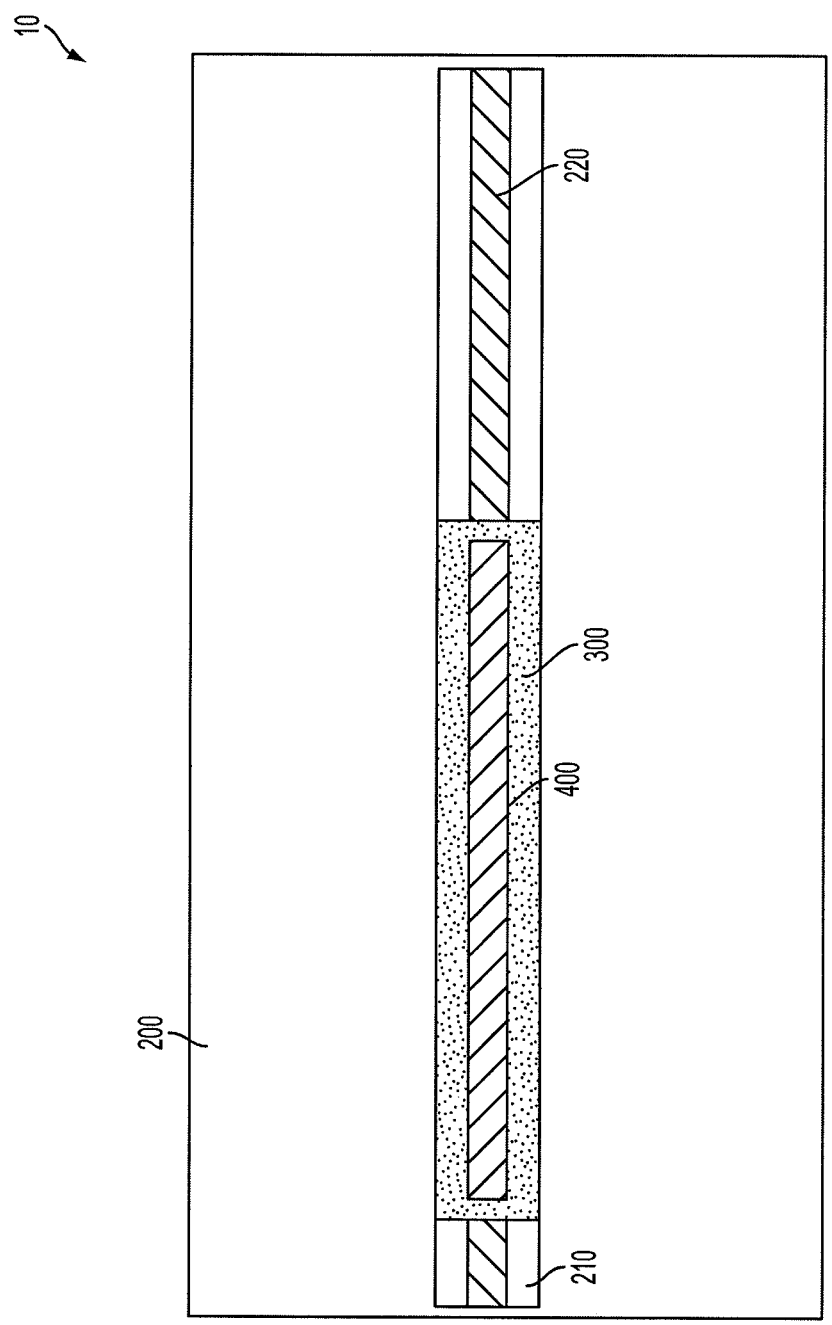
FIG. 5 is a schematic of a photovoltaic module including first and second conductors.

Referring now to FIG. 3, a second lead foil 400 can be placed on second tape strip 300. Second lead foil 400 can have a length substantially similar to that of second tape strip 300, or it can be substantially or slightly smaller. Second lead foil 400 can extend a length substantially longer than any exposed portion of first lead foil 220. For example, second tape strip 300 and second lead foil 400 can extend near to an end of first tape strip 210, as shown in FIGS. 2 and 3, but not to the end of first tape strip 210, thereby leaving a comparatively small portion of first lead foil 220 exposed. Alternatively, as shown in FIGS. 4 and 5, second tape strip 300 and second lead foil 400 may be applied with one end proximate to the middle of first tape strip 210. Second tape strip 300 and second lead foil 400 may be closer to one end of first tape strip 210 than to another.

A plurality of common conductors (e.g., bus bars) can be applied to the first and second lead foils. The plurality of common conductors may include any suitable number of conductive materials. For example, two positive common conductors and one negative common conductor may be applied adjacent to the photovoltaic module. The positive and negative common conductors may have any suitable width, including, for example, more than about 5 mm, or less than about 15 mm. For example, a connection assembly may include a common conductor having a width of about 11 mm. The positive conductors may be applied adjacent to the first lead foil, and the negative conductor may be applied adjacent to the second lead foil.

In one embodiment, the positive conductor may be positioned at opposite ends of the module, including, for example, at opposite ends of first tape strip 210 and first lead foil 220. The negative conductor may be positioned substantially proximate to an end of second lead foil 400. The positive conductor and first lead foil 220 may define a positive region of the photovoltaic module. The negative conductor and second lead foil 400 may define a negative region of the photovoltaic module.

In another embodiment, the relative size of the negative and positive regions may be configured to reduce the module's susceptibility to corrosion. For example, the negative region can be substantially larger than the positive region. For example, the negative region may have a surface area larger than that of the positive region by any suitable factor, including, for example, more than 1.1, more than 1.5, more than 2, more than 3, less than 5, or less than 4. The relative proportions of the negative to positive regions may be configured by adjusting the conductive components included within the regions. For example, the lead foils or common conductors (e.g., bus bars) may be reduced in length, width, or thickness. Further, the ratio of positive to negative components may be modified. For example, instead of having two positive common conductors and one negative common conductor, the connection assembly may include two negative common conductors and one positive common conductor. The spacing between the common conductors may also be adjusted, as necessary, and consistent with operational parameters, to reduce the relative positive portions of the connection assembly. The preferred length/area ratio between the negative and positive conductors/regions depends on a variety of factors, including, for example, conductor physical properties, current density, surface area, and coating thickness.

Figure 6:
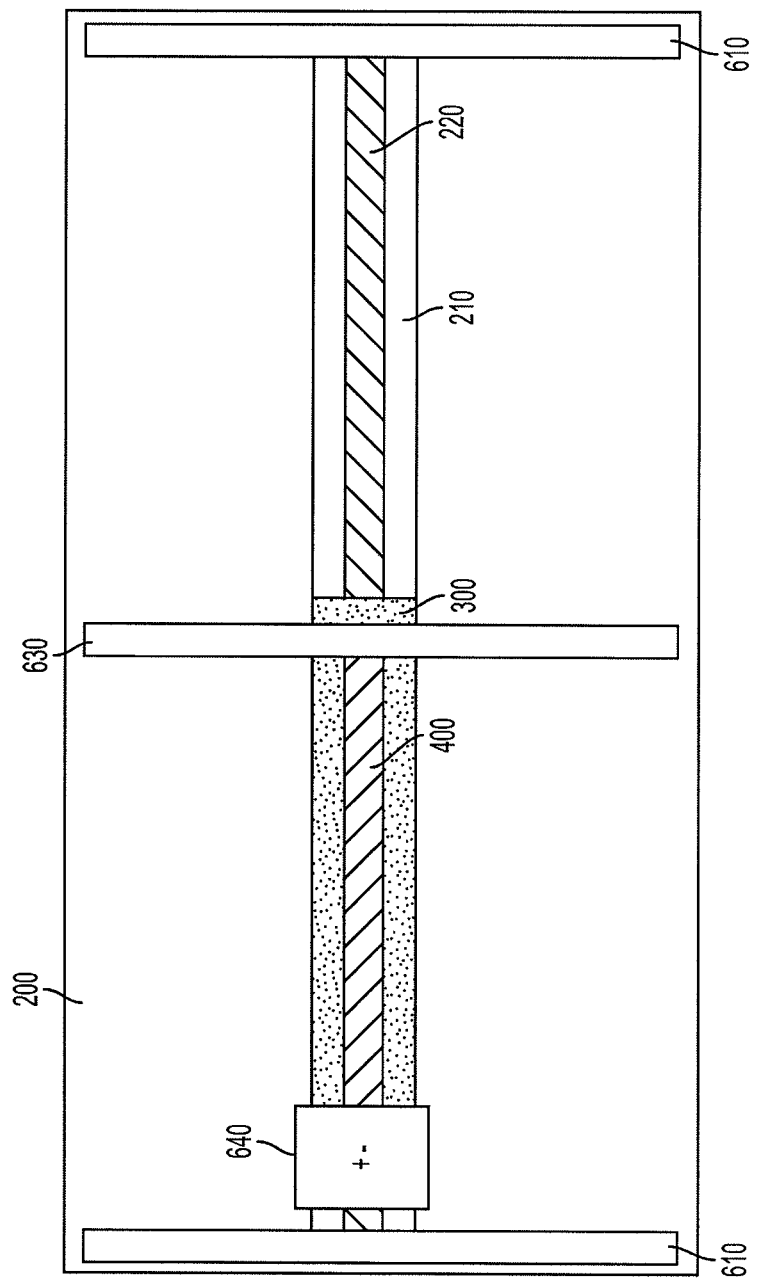
FIG. 6 is a schematic of a photovoltaic module including first and second conductors.
Figure 7:
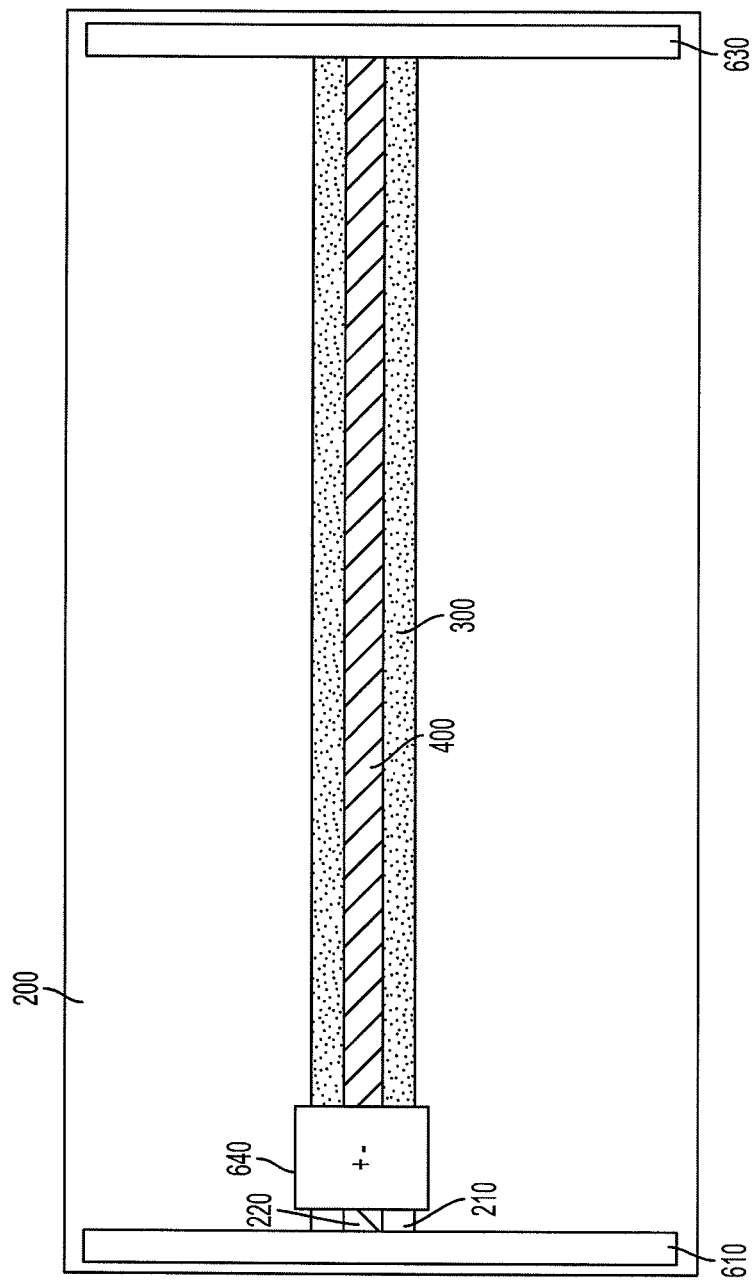
FIG. 7 is a schematic of a photovoltaic module including first and second conductors.
Figure 8:
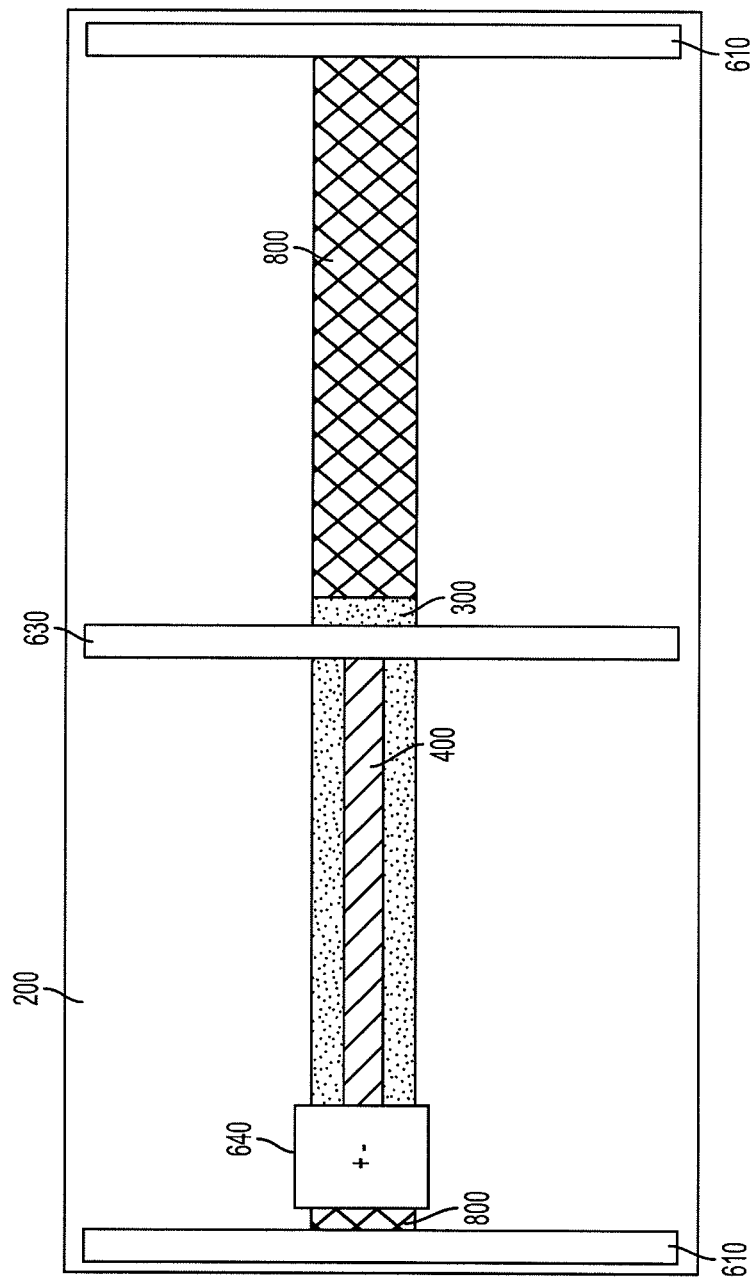
FIG. 8 is a schematic of a photovoltaic module including first and second conductors.
Figure 9:
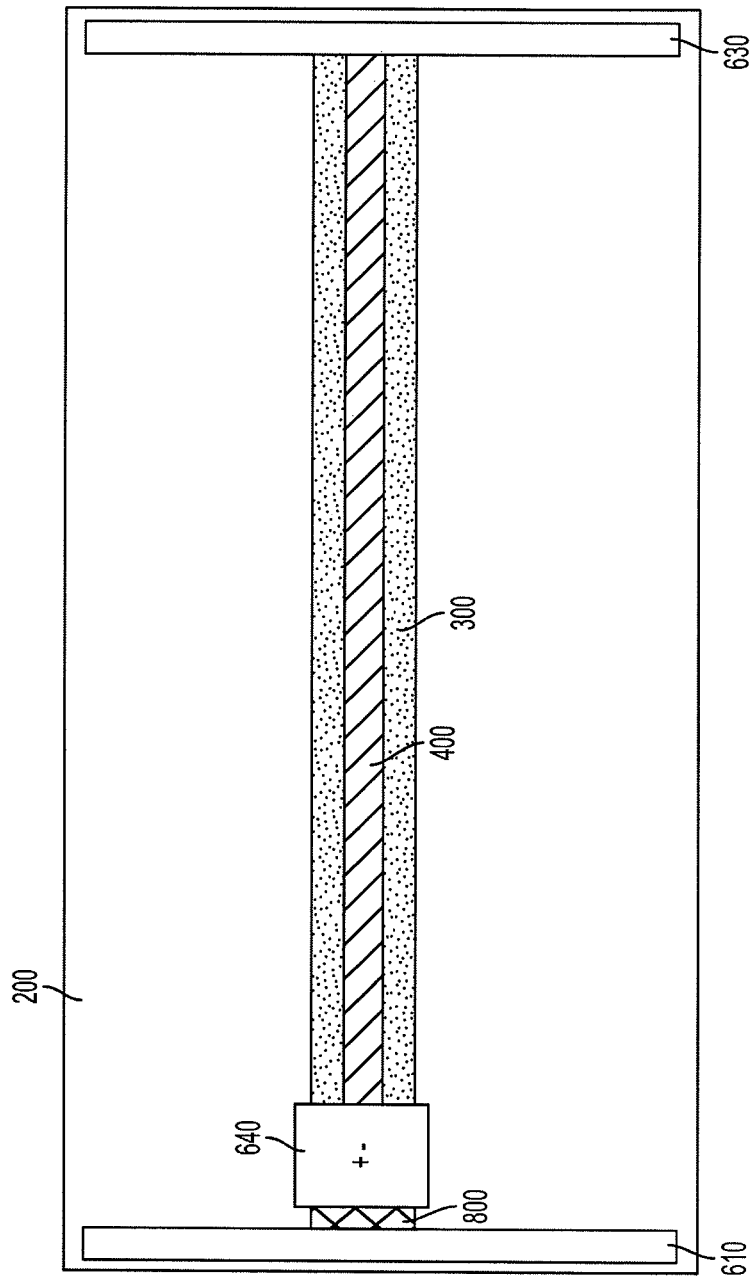
FIG. 9 is a schematic of a photovoltaic module including first and second conductors.

A variety of methods are available for increasing the relative negative to positive conductive regions. For example, the a junction box for the module may be positioned to reduce the relative positive conductor length and increase the relative negative conductor length. The junction box can include a structure at which positive and negative common conductors of the module can be connected to respective insulated conductors that allow the module to be connected in an array with other modules. Referring to FIGS. 6 and 7, by way of example, positive common conductors 610 and negative common conductor 630 can be applied adjacent to back contact 200. The junction box 640 may be positioned close to one of positive common conductors 610, to minimize the amount of positively charged lead foil 220 therebetween. Junction box 640 can include a cord plate and can include any suitable material. Junction box 640 can include a plastic material, a resin, and/or a polymer. The proportionately larger ratio of negative to positive regions can provide additional cathodic protection for the connection assembly of the photovoltaic module, thereby reducing susceptibility to corrosion. Examples of ratios of positive to negative regions (for example, measured by the lengths of the conductors in the regions, or the mass of the conductors) include a negative to positive ratio of about 1.1:1 to about 10:1, about 1.1:1 to about 8:1, about 1.1:1 to about 5:1, about 1.1:1 to about 4:1, about 1.1:1 to about 3:1, about 1.1:1 to about 2:1, about 1.5:1 to about 3:1, about 2:1 to about 3:1, about 3:1 to about 10:1, about 3:1 to about 8:1, about 3:1 to about 5:1, about 5:1 to about 10:1, about 5:1 to about 8:1, about 8:1 to about 10:1, or any other suitable ratio or range of ratios. In another embodiment, corrosion may be reduced by positioning an overlay material over the positive regions of the exposed connection assembly. For example, referring to FIGS. 8 and 9, one or more strips of insulative tape 800, such as double sided insulative tape, for example, may be positioned over an exposed portion of first tape strip 210 and first lead foil 220. The exposed portion may include a positive region defined by an exposed portion of first tape strip 210 and first lead foil 220. Insulative tape 800 may include any suitable material, including, for example, a polyethylene terephthalate (PET), or any suitable insulating polymeric material. Insulative tape 800 may reduce the likelihood of corrosion occurring on the connection assembly, for example, when an interlayer material, such as an ethylene vinyl acetate (EVA), is applied. Thus insulative tape 800 (or any other suitable overlay) can improve cathodic protection, by allowing only the negative regions of the connection assembly to be exposed. Insulative tape 800 can separate any exposed portion of first tape strip 210 and first lead foil 220 from any interlayer material deposited in the photovoltaic module. FIGS. 8 and 9 depict insulative tape 800 positioned over a portion of positive common conductors 610. It should be noted that a smaller or larger portion of the positive common conductors may be covered, including, for example, no portion at all.

Figure 10:
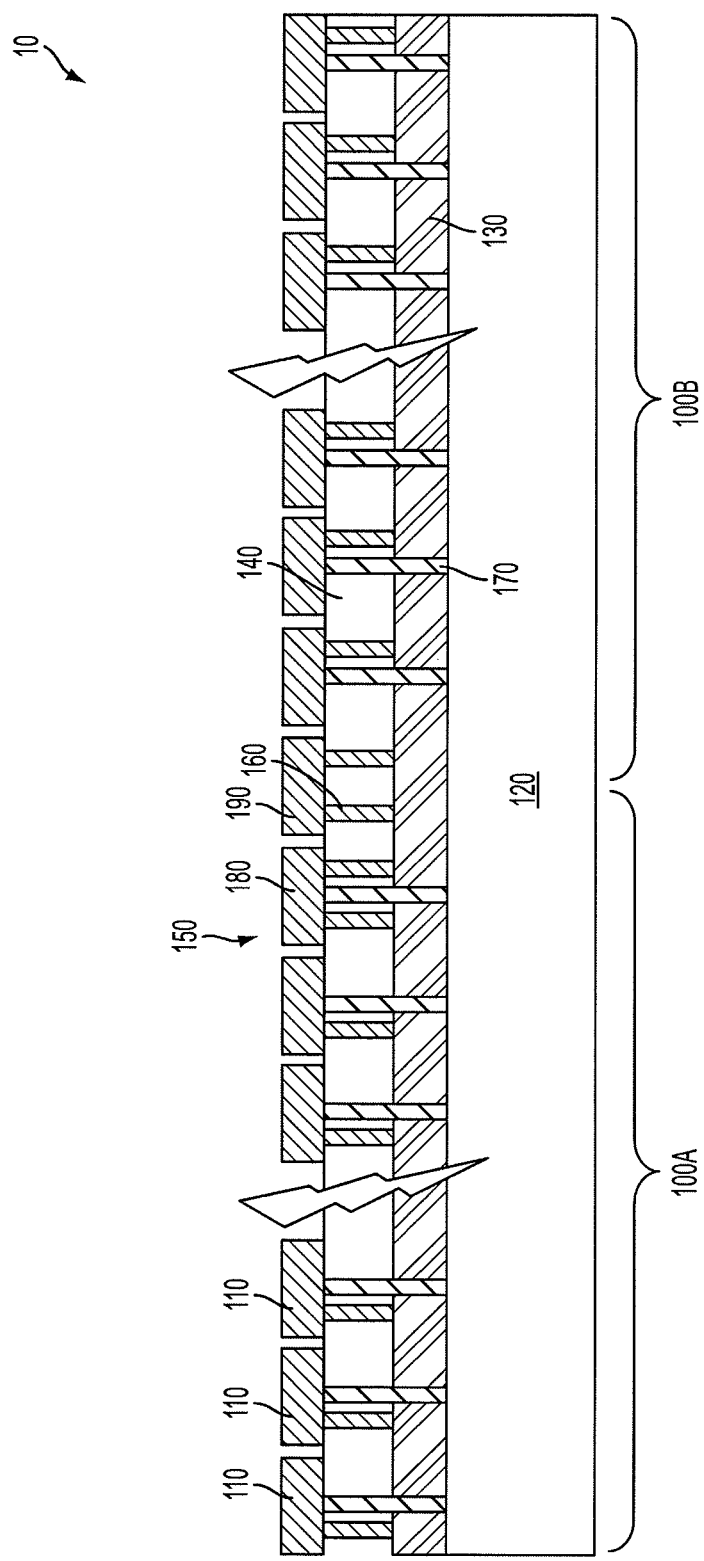
FIG. 10 is a schematic of multiple interconnected photovoltaic cells.

Referring now to FIG. 10, in another embodiment, photovoltaic module 10 may have any suitable configuration. For example, photovoltaic module 10 may have a plurality of photovoltaic cells 110. The plurality of photovoltaic cells 110 may be connected and/or arranged in any suitable configuration. For example, one or more photovoltaic cells 110 may be connected in series. Photovoltaic module 10 can have any suitable number of photovoltaic cells. For example, photovoltaic module 10 may include a high cell count (e.g., 144 cells or more) to reduce the likelihood of corrosion occurring on the connection assembly. For example, photovoltaic module 10 may include a cell count of more than about 144, more than about 154, more than about 176, more than about 180, or less than about 180. A connection assembly may be applied to the module. The high cell count can result in a reduced current density for the lead foils. For example, the lead foils may have a current density of less than about 3.8 $\mu A/\mu m^2$, or less than about 3.7 $\mu A/\mu m^2$. The reduced current density of the lead foils can lead to a reduced corrosion rate for photovoltaic module 10, including for example, less than about 50%, less than about 40%, or less than about 30%.

As shown in FIG. 10, photovoltaic module 10 may have one or more submodules, each of which may include one or more photovoltaic cells 110. For example, photovoltaic module 10 can be formed by connecting a first submodule 100A to a second submodule 100B. Each submodule can include a plurality of photovoltaic cells 110 connected in series. Photovoltaic module 10 can include a transparent conductive layer 130 on a substrate 120. Transparent conductive layer 130 can include any suitable material, including a transparent conductive oxide. For example, transparent conductive layer 130 may include a cadmium stannate. Substrate 120 can include any suitable substrate material. For example, substrate 120 may include a glass. Photovoltaic module 10 may include one or more semiconductor layers 140 deposited on transparent conductive layer 130. Semiconductor layer 140 may include a cadmium telluride on a cadmium sulfide. A contact metal 180 can be deposited onto semiconductor layer 140.

In continuing reference to FIG. 10, substrate 120, transparent conductive layer 130, semiconductor layer 140, and contact metal 180 can all be part of first submodule 100A and second submodule 100B. Submodules 100A and 100B can be scribed to form one or more trenches. For example, a trench 150 can be scribed into contact metal 180 to delineate photovoltaic cells 110. Trench 160 can be scribed to create a via into which contact metal 180 can flow to create electrical contact with transparent conductive layer 130. Trench 170 can be scribed, and an insulator can be deposited therein. The insulator can include any suitable material, including a dielectric material, atmosphere or a vacuum. The insulator can be in a constant position among photovoltaic cells connected in series. The insulator can penetrate the semiconductor material, the transparent conductive layer, or both. The insulator can have a length that spans the length of a semiconductor material and a transparent conductive layer combined. Submodules 100A and 100B can thus each have three different trench patterns for each photovoltaic cell 110. The trench patterns can be formed using any suitable method, including, for example, laser ablation, laser scribing, wet-chemical etching, or dry etching.

Photovoltaic module 10 can include a shared cell 190 at the center between first and second submodules 100A and 100B. Shared cell 190 can be flanked by two electrical contacts 160 between transparent conductive layer 130 and contact metal 180. Shared call 190 can connect submodules 100A and 100B in parallel. Thus the total current output of photovoltaic module 10 can be the sum of the currents of each submodule.

The parallel interconnection of submodules 100A and 100B, as shown in FIG. 10, can be obtained by allowing both submodules to share the contact to transparent conductive layer 130 on substrate 120. First submodule 100A and second submodule 100B can be connected in parallel and contacted to transparent conductive layer 130 through shared cell 190. First submodule 100A can have an electrical contact region including a first trench pattern, where the first trench pattern is a pattern of photovoltaic cells connected in series, and a last cell in the series is the shared cell. Second submodule 100B can have an electrical contact region including a second trench pattern, where the second trench pattern is a mirror image of the first trench pattern, the mirror image having symmetry about the shared cell. This structure can be applied to any number of submodules, N (where N is a natural number greater than 1). The output voltage of the module will decrease proportionally with N. This provides the ability to control the output voltage of the modules to optimally meet a solar array's system requirements. Following interconnection of the cells and/or submodules, any of the connection assemblies discussed herein may be applied, and configured for connecting with one or more additional modules.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A photovoltaic module comprising:
a plurality of photovoltaic cells forming a contact region with a contact surface, wherein the plurality of photovoltaic cells are electrically interconnected and separated by scribes, the plurality of photovoltaic cells comprising:
a transparent conductive layer over a substrate;
a semiconductor layer over the transparent conductive layer; and
a contact metal layer over the semiconductor layer;
a first submodule comprising a first subset of the plurality of photovoltaic cells connected in series;
a second submodule comprising a second subset of the plurality of photovoltaic cells connected in series, wherein the first and second submodules are connected in parallel and electrically connect to the transparent conductive layer through the contact metal layer of a shared cell;
a first insulator strip over the contact surface and across the plurality of photovoltaic cells;
a first lead foil along a length of the first insulator strip;
a second insulator strip over the first lead foil;
a second lead foil over a portion of the second insulator strip, wherein the second lead foil is collinear with the first lead foil for the entire length of the second lead foil;
a first negative common conductor, wherein the first negative common conductor electrically connects to the second lead foil; and
a first positive common conductor and a second positive common conductor, positioned at opposite ends of the photovoltaic module, the first and second positive common conductors positioned perpendicular to the first insulator strip and located over the contact surface, wherein the first positive common conductor and the second positive common conductor electrically connect the contact surface to the first lead foil, wherein a total number of cells in the first and the second subsets of the plurality of photovoltaic cells is 154 to 180 cells, whereby the first lead foil is configured to carry a current density of less than 3.7 $\mu A/\mu m2$; and
an insulating polymeric material over the first lead foil and positioned between the first negative common conductor and each of the first and second positive common conductors; and
wherein the insulating polymeric material is not positioned over the first negative common conductor, and wherein the insulating polymeric material is not positioned over the second lead foil.

2. The photovoltaic module of claim 1, wherein the insulating polymeric material is polyethylene terephthalate (PET).

3. The photovoltaic module of claim 1, wherein the total number of cells in the first and the second subsets of the plurality of photovoltaic cells is 176 to 180 cells.

4. A method of mitigating corrosion in a photovoltaic module, the method comprising:
providing the photovoltaic module comprising a plurality of photovoltaic cells forming a contact region with a contact surface, wherein the plurality of photovoltaic cells are electrically interconnected and separated by scribes;
the plurality of photovoltaic cells comprising:
a transparent conductive layer over a substrate;
a semiconductor layer over the transparent conductive layer; and
a contact metal layer over the semiconductor layer;
wherein a first submodule comprises a first subset of the plurality of photovoltaic cells connected in series;
wherein a second submodule comprises a second subset of the plurality of photovoltaic cells connected in series; and
wherein the first and second submodules are connected in parallel and electrically connect to the transparent conductive layer through the contact metal layer of a shared cell;
applying a first insulator strip over the contact surface and across the plurality of photovoltaic cells;
positioning a first lead foil on the first insulator strip, along a length of the first insulator strip;
applying a second insulator strip over the first lead foil;
positioning a second lead foil over a portion of the second insulator strip, wherein the second lead foil is collinear with the first lead foil for the entire length of the second lead foil;
positioning a first negative common conductor proximate to an end of the second lead foil, wherein the first negative common conductor electrically connects to the second lead foil;

positioning a first positive common conductor and a second positive common conductor at opposite ends of the photovoltaic module, the first and second positive common conductors positioned perpendicular to the first insulator strip and located over the contact surface, wherein the first positive common conductor and the second positive common conductor electrically connect the contact surface to the first lead foil;

electrically connecting a junction box to the first negative common conductor and to the first positive common conductor and to the second positive common conductor;

configuring the first and the second subsets of the plurality of photovoltaic cells to have a total number of cells of 154 to 180 cells, whereby the first lead foil is configured to carry a current density of less than 3.7 $\mu A/\mu m^2$; and applying an insulating polymeric material over the first lead foil and positioned between the first negative common conductor and each of the first and second positive common conductors, wherein the insulating polymeric material is not positioned over the first negative common conductor, and wherein the insulating polymeric material is not positioned over the second lead foil.

5. The method of claim 4, further comprising:

placing the junction box closer to the first positive common conductor than to the first negative common conductor.

6. The method of claim 4, wherein the total number of cells in the first and the second subsets of the plurality of photovoltaic cells is 176 to 180 cells.

* * * * *